(12) United States Patent
Greenberg et al.

(10) Patent No.: US 7,375,597 B2
(45) Date of Patent: May 20, 2008

(54) LOW-NOISE FINE-FREQUENCY TUNING

(75) Inventors: Jody Greenberg, Sunnyvale, CA (US);
Sehat Sutardja, Los Altos, CA (US)

(73) Assignee: Marvell World Trade Ltd. (BB)

( * ) Notice: Subject to any disclaimer, the term of this patent is extended or adjusted under 35 U.S.C. 154(b) by 0 days.

(21) Appl. No.: 11/242,230

(22) Filed: Oct. 3, 2005

(65) Prior Publication Data

US 2007/0024379 A1 Feb. 1, 2007

Related U.S. Application Data

(60) Provisional application No. 60/722,732, filed on Sep. 30, 2005, provisional application No. 60/704,280, filed on Aug. 1, 2005.

(51) Int. Cl.
*H03B 1/00* (2006.01)
(52) U.S. Cl. .................. 331/74; 331/176; 331/177 V; 331/158; 331/117 FE; 331/117 R
(58) Field of Classification Search ............... 331/176, 331/158, 116 R, 177 V, 117 FE, 74
See application file for complete search history.

(56) References Cited

U.S. PATENT DOCUMENTS

| | | | |
|---|---|---|---|
| 4,228,713 A | 10/1980 | Gross | |
| 4,893,097 A | 1/1990 | Zwack | |
| 5,053,723 A * | 10/1991 | Schemmel | 331/14 |
| 5,081,431 A | 1/1992 | Kubo et al. | |
| 5,574,408 A | 11/1996 | Zwack | |
| 5,659,270 A | 8/1997 | Millen et al. | |
| 5,809,336 A | 9/1998 | Moore et al. | |
| 6,160,458 A | 12/2000 | Cole et al. | |
| 6,598,148 B1 | 7/2003 | Moore et al. | |
| 6,803,829 B2 | 10/2004 | Duncan et al. | |
| 6,850,125 B2 | 2/2005 | Norman et al. | |
| 2004/0071029 A1 | 4/2004 | Sutardja | |

FOREIGN PATENT DOCUMENTS

| | | |
|---|---|---|
| EP | 0 766 376 A1 | 4/1997 |
| EP | 1119108 A2 | 7/2001 |
| EP | 1143606 A1 | 10/2001 |
| EP | 1 411 630 A1 | 4/2004 |

* cited by examiner

*Primary Examiner*—Arnold Kinkead

(57) ABSTRACT

Circuits, methods, apparatus, and code that provide low-noise and high-resolution electronic circuit tuning. An exemplary embodiment of the present invention adjusts a capacitance value by pulse-width modulating a control voltage for a switch in series with a capacitor. The pulse-width-modulated control signal can be adjusted using entry values found in a lookup table, by using analog or digital control signals, or by using other appropriate methods. The capacitance value tunes a frequency response or characteristic of an electronic circuit. The response can be made to be insensitive to conditions such as temperature, power supply voltage, or processing.

30 Claims, 14 Drawing Sheets

LOW-NOISE FINE-FREQUENCY TUNING

This application claims the benefit of U.S. provisional application Nos. 60/704,280, filed Aug. 1, 2005, and 60/722,732, filed Sep. 30, 2005, which are incorporated by reference.

BACKGROUND

The present invention relates generally to electronic circuit tuning, and more particularly to pulse-width modulating capacitors to achieve low-noise, fine-frequency tuning.

The ability to finely tune a frequency response or characteristic of an electronic circuit while maintaining low noise is very desirable in applications such as wired or wireless switches, controllers, and transceivers, filters, power management, data storage, and others. The pursuit of this goal has taken many forms: each with limited success.

For example, crystals can be used where high accuracy and low temperature drift is needed. But these devices cannot be included on an integrated circuit. As a separate device, it requires the use of at least one integrated circuit pin and consumes system board space.

Varactor diodes have the advantage that they can be included on an integrated circuit. But when the capacitance of a varactor diode is tuned using an analog voltage provided in an open loop manner, the resulting noise can create difficulties. The current in the circuit that generates the control voltage can be increased in order to reduce the noise, but this is very undesirable, particularly in battery powered electronic systems.

Digitally adjusted capacitors (capacitors that are either connected or disconnected using a switch) can be used to improve on this noise issue. Digitally adjusted capacitors are typically either equally or binarily weighted. Where they are equally weighted, a large number of capacitors and corresponding switches are required to provide tuning having a large tuning range with a fine resolution. Where they are binarily weighted, the smallest capacitors are limited in size by their switches' parasitic capacitances, while the largest capacitors are limited by die area considerations. Thus, once again, it is difficult to finely tune the circuit's response or characteristic.

Thus, what is needed are circuits, methods, apparatus, and code that provide low-noise and high-resolution tuning for electronic circuits.

SUMMARY

Accordingly, embodiments of the present invention provide circuits, methods, apparatus, and code that allow electronic circuits to be tuned with low-noise and a high degree of resolution. An exemplary embodiment of the present invention adjusts a capacitance value by pulse-width modulating a capacitor, that is, by pulse-width modulating a control voltage for a switch in series with a capacitor. The pulse-width-modulated control signal can be controlled using entries in a lookup table, by an analog voltage or digital signals, or by other appropriate methods. The capacitance value sets a frequency response or characteristic of the electronic circuit. Examples of the response or characteristic include oscillation frequency, high or low cutoff frequency, bandwidth, and other responses and characteristics.

The response or characteristic can be made to be insensitive to conditions such as temperature, voltage supply, processing, and others. Alternately, other desired relationships between a condition and frequency response can be achieved. This can be done by first calibrating the circuit. For example, pulse-width modulation signals required for a specific frequency response can be determined. This determination can be made as a function of one or more conditions, with the results stored in a lookup table. During device operation, the condition is used to find entries in the lookup table. The entry is then used to pulse-width modulate a signal driving a switch in series with a capacitor to achieve the specific frequency response or characteristic.

A specific embodiment of the present invention provides an oscillator circuit having an oscillation frequency set by a pulse-width modulated capacitor. During calibration, at several temperatures, the required pulse-width modulation is determined such that the oscillator operates at a desired frequency. Entries corresponding to the required pulse-width modulation are stored at locations identified by the corresponding temperature. During operation, device temperature is measured and the corresponding pulse-width modulation information is found in the table. A control voltage for a switch in series with a capacitor is pulse-width modulated, resulting in the oscillator running at the desired frequency. Various embodiments of the present invention may incorporate one or more of these or the other features described herein.

One exemplary embodiment of the present invention provides an integrated circuit. This integrated circuit includes means for receiving a measurement of a condition; means for using the measurement of the condition to set a duty cycle of a pulse-width modulated signal, and means for varying a capacitance using the pulse-width modulated signal.

This or other embodiments may further provide the condition being temperature. This or other embodiments may further provide means for varying the capacitance by controlling the impedance of a switch using the pulse-width modulated signal. This or other embodiments may further provide the capacitance being varied by driving a gate of a transistor with the pulse-width modulated signal. This or other embodiments may further provide for the pulse-width modulated signal being generated by using the measurement of the condition to retrieve a stored entry. This or other embodiments may further provide means for an oscillator where the frequency characteristic is the oscillator's frequency of oscillation.

Another exemplary embodiment of the present invention provides another integrated circuit. This integrated circuit includes means for tuning a frequency characteristic of an integrated circuit. This further includes means for receiving a measurement of a condition, means for retrieving a stored entry using the measurement of the condition; means for generating a pulse-width modulated signal using the entry; and means for controlling the impedance of a switch using the pulse-width modulated signal, wherein the switch is in series with a capacitor.

This or other embodiments may further provide for the switch being an MOS transistor. This or other embodiments may further provide for the condition being temperature. This or other embodiments may further provide for the measurement of a condition being a voltage proportional to temperature. This or other embodiments may further provide means for an oscillator where the frequency characteristic is the oscillator's frequency of oscillation. This or other embodiments may further provide means for generating the measurement of the condition by generating a voltage proportional to temperature; means for converting the voltage to a digital signal; and means for retrieving the stored entry using the digital signal. This or other embodiments may further provide for the stored entry being determined such that the frequency of the oscillator is stable over temperature. This or other embodiments may further provide for the voltage being converted to a digital signal using an analog-to-digital converter. This or other embodiments may further provide for the transistor switch being a MOS transistor.

Embodiments of the present invention may be implemented in code, for example, code to be used in a digital signal processor or compiled using VHDL. One such embodiment provides code for a control signal generator having an input responsive to a measurement of a condition and configured to provide a control signal in response to the measurement; code for a pulse-width modulation circuit having an input responsive to the control signal and an output configured to provide a pulse-width modulated signal in response to the control signal; and code for a variable capacitance having a capacitance value variable in response to the pulse-width modulated signal.

This or other embodiments may further provide for the condition being temperature. This or other embodiments may further provide for the variable capacitance comprising a switch having a control input responsive to the pulse-width modulated signal, and a capacitor in series with the switch. This or other embodiments may further provide for the integrated circuit comprising an oscillator. This or other embodiments may further provide for the integrated circuit comprising an oscillator, the oscillator oscillating at a frequency determined at least in part by the capacitor and the pulse-width modulated signal's duty cycle. This or other embodiments may further provide the control signal generator circuit comprising a lookup table.

Another exemplary embodiment of the present invention provides code for a memory comprising a plurality of entries, each entry corresponding to a value of a measurement of a condition; code for a pulse-width modulator circuit configured to generate a pulse-width modulated signal, the pulse-width modulated signal having a duty cycle, the duty cycle determined by an entry in the memory; code for a switch responsive to the pulse-width modulated signal; and code for a capacitance in series with the switch.

This or other embodiments may further provide for the switch being an MOS transistor. This or other embodiments may further provide code for an analog-to-digital converter configured to convert an analog voltage corresponding to the measurement of the condition to a digital signal and further configured to provide the digital signal to the look-up table. This or other embodiments may further provide for the measurement of a condition being a voltage proportional to temperature. This or other embodiments may further provide for the integrated circuit comprising an oscillator and the frequency characteristic is the oscillator's frequency of oscillation.

A further embodiment of the present invention provides code for an oscillator. This code includes code for a condition measurement circuit configured to provide an analog voltage proportional to temperature; code for an analog-to-digital converter configured to convert the analog voltage to a digital signal; code for a lookup table responsive to the digital signal from the analog-to-digital converter, code for a pulse-width modulation circuit configured to provide a pulse-width modulated signal having a duty cycle, the duty cycle controlled by entries in the lookup table; code for a transistor having a gate responsive to the pulse-width modulated signal; and code for a capacitor in series with the transistor.

This or other embodiments may further provide for the lookup table comprising multiple entries, the entries determined such that the frequency of the oscillator is stable over temperature. This or other embodiments may further provide for the first circuit being a proportional-to-absolute temperature voltage generator. This or other embodiments may further provide for the transistor being a MOS transistor.

A better understanding of the nature and advantages of the present invention may be gained with reference to the following detailed description and the accompanying drawings.

DESCRIPTION OF EXEMPLARY EMBODIMENTS

Figure 1:
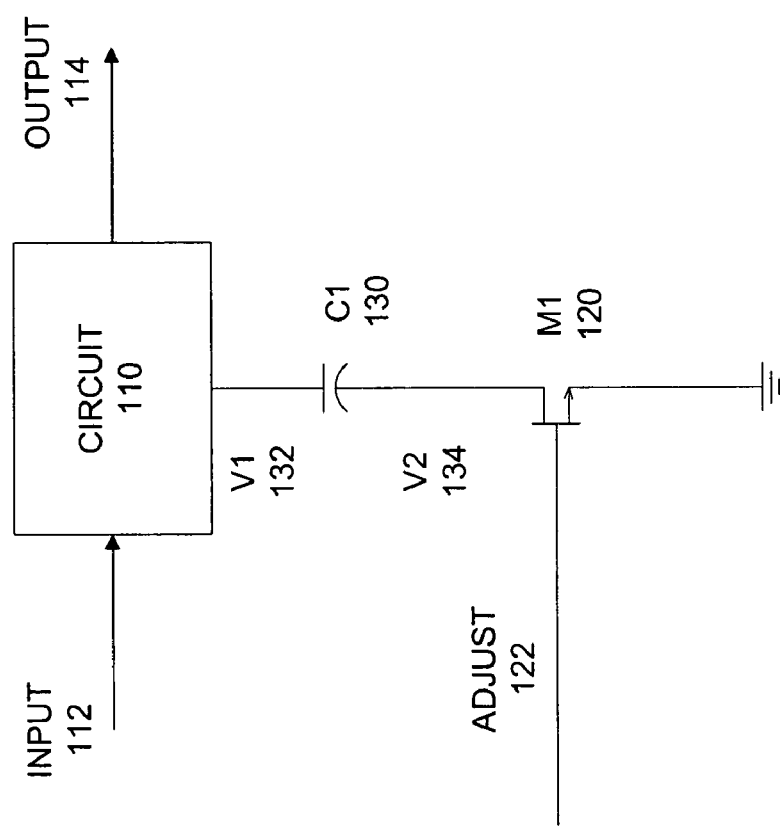
FIG. 1 is a schematic of a circuit having a frequency characteristic tuned by a pulse-width modulated capacitor according to an embodiment of the present invention.

FIG. 1 is a schematic of a circuit having a frequency response or characteristic tuned by a pulse-width modulated capacitor according to an embodiment of the present invention. This figure includes a circuit 110, transistor M1 120, and capacitor C1 130. The circuit 110 has a frequency response or characteristic that is at least partially determined by the effective capacitance value of the capacitor C1 130. The circuit 110, transistor 120, and capacitor 130 may be included on an integrated circuit. This figure, as with the other included figures, is shown for exemplary purposes and does not limit either the possible embodiments of the present invention or the claims.

The adjust signal on line 122 adjusts or controls the impedance of transistor M1 120. When the level of the adjust signal on line 122 is high, and transistor M1 120 is on and connects capacitor C1 130 to ground, in effect connecting capacitor C1 130 to the circuit 110. When the adjust signal on line 122 is low, the impedance of transistor M1 120 is high, allowing capacitor C1 130 to float, effectively disconnecting the capacitor C1 130 from the circuit 110. When this capacitor is connected to ground, it is at least partially responsible for determining a frequency characteristic of the circuit 110. Conversely, when the capacitor C1 130 is floating, it has a reduced effect on this frequency response or characteristic.

However, when the capacitor C1 130 is floating it is not completely removed or disconnected. Transistor M1 120 includes parasitic capacitances, notably the drain-to-gate capacitance and the capacitance of the drain-to-bulk diode, that remain in series with capacitor C1 130 when transistor M1 120 is off. These parasitic capacitances limit the minimum practical size of C1 130. This in turn limits the resolution with which the frequency characteristic of the circuit 110 can be tuned.

Accordingly, embodiments of the present invention adjust the size of capacitor C1 130 with a finer resolution by applying a switching signal having a variable duty cycle, specifically the adjust signal on line 122. By varying the duty cycle of the adjust signal on line 122, the capacitor C1 130 is connected to the circuit 110 part of the time, and disconnected from the circuit 110 for the remainder. In this way, a duty cycle adjustment can be used to vary the effective of size of capacitor C1 130. That is, as the duty cycle increases and device M1 120 is on for a greater portion of time, the effective size of capacitor C1 130 is increased, while as the duty cycle is decreased, device M1 120 conducts or is on for a shorter portion and the effective size of C1 130 is thereby reduced.

Thus, a frequency response or characteristic of the circuit 110 can be adjusted by varying the duty cycle of the adjust signal on line 122. However, it should be noted that changes in the frequency of the adjust signal on line 122 by themselves do not have a first-order effect on the effective capacitance provided by the capacitor C1 130.

During operation when M1 120 is on, the voltage V2 on line 134 (the drain of M1 120) is near ground. When the adjust signal on line 122 switches low thereby shutting off M1 120, the voltage V2 on line 134 is allowed to float. Accordingly, the voltage V2 on line 134 tracks changes in the voltage V1 on line 132. Later, when the adjust signal on line 122 returns high and M1 120 conducts, the voltage V2 on line 134 is again forced to ground. If the voltage V2 on line 134 has floated from ground when device M1 120 turns on, charge is injected through C1 130 into the circuit 110. This charge injection should be accounted for in the design of the circuit 110 and the timing of the adjust signal on line 122. It should also be noted that the drain-to-bulk diode might turn on and clamp the voltage V2 on line 134 when the capacitor C1 130 is allowed to float, specifically when the voltage V2 on line 134 floats below ground. This clamping can be minimized by ensuring that the signal swing at V1 132 does not exceed a few hundred millivolts.

In a specific embodiment of the present invention, the circuit 110 is an oscillator that provides an oscillatory signal at a frequency that is determined at least in part by the effective value of the capacitor C1 130. In this embodiment, the adjust signal on line 122 is opened and closed at a frequency that is a sub-harmonic of the frequency of the oscillator. Accordingly, each time the transistor M1 120 closes or begins to conduct, the voltage V2 on line 134 is near ground, thus limiting the charge injection back into the oscillator.

In this exemplary figure, the circuit 110 receives an input signal on line 112 and provides an output on line 114. In various embodiments of the present invention, there is no input signal 112, for example where the circuit 110 is an oscillator as described above. The input and output signals may use single-ended or differential signaling techniques. Typically, lines in this and the other figures may be one line, or a group of lines, such as a bus.

The capacitor C1 130 may be in parallel or in series with one or more other capacitors that may or may not be connected to switches. The capacitor C1 130 may be a metal-sinker capacitor, a metal-to-metal capacitor, or other type of capacitor. It may be one capacitor, or a combination of more than one individual capacitor. The transistor M1 120 may be an n-channel MOS device as shown. Alternately it may be a p-channel MOS device, bipolar device, HFET, HBT, MESFET, or other type of transistor. In other embodiments of the present invention, the transistor M1 120 may be replaced by another type of switch such as a pass or tri-state gate. Also, in some embodiments the switch and the capacitor may be combined into a single composite structure. While these figures show a switch transistor coupled between a capacitor and ground, in various embodiments, the switch may be between the capacitor and the circuit, between the capacitor and another node, such as a bias voltage or a supply voltage, or the switch and capacitor may be take on other arrangements.

The circuit 110 may be an oscillator as previously described, a filter, or other circuit where a variable frequency response or characteristic is desired. One example of an oscillator incorporating an embodiment of the present invention is shown in the next figure.

Figure 2:
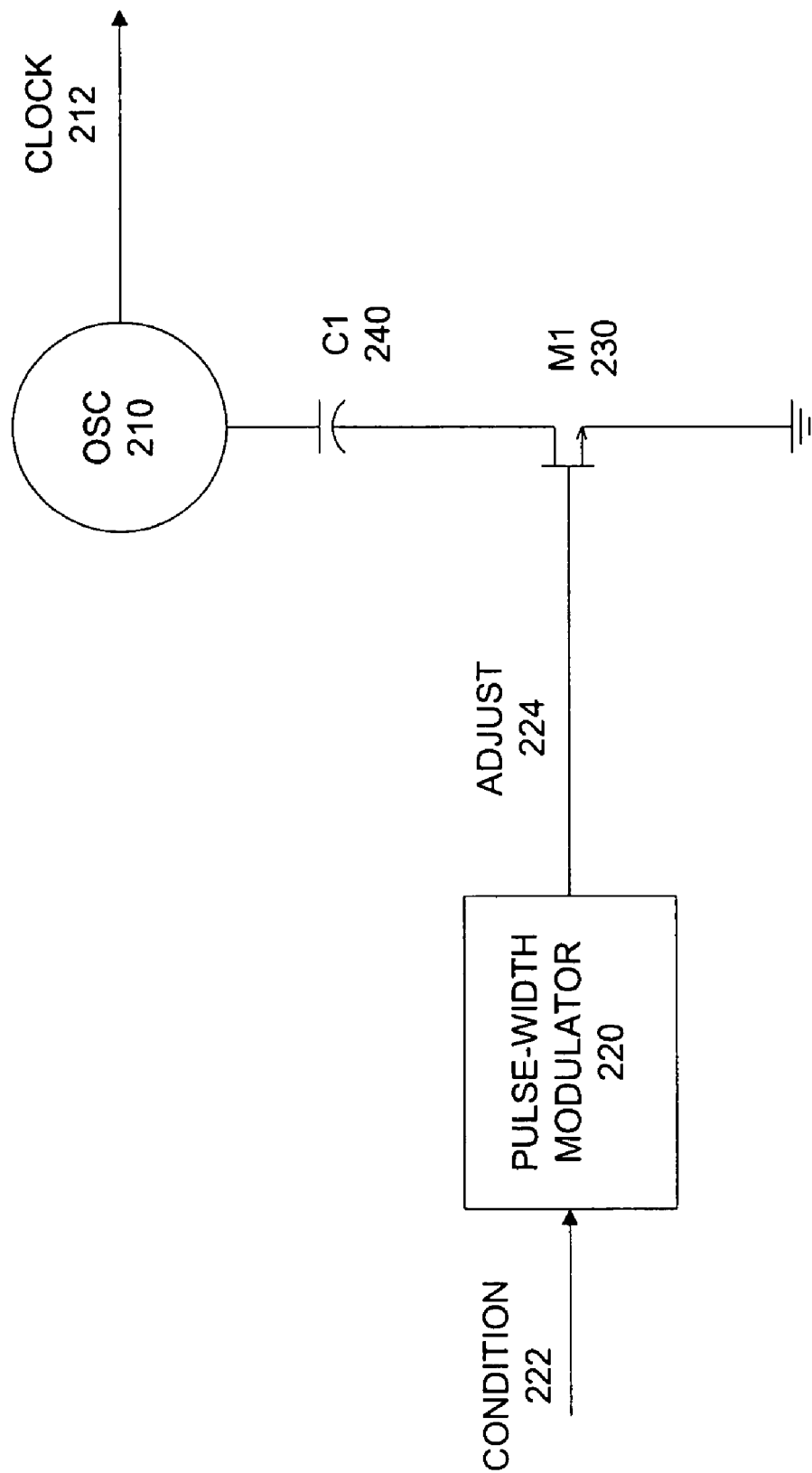
FIG. 2 is a block diagram of a free-running oscillation circuit according to an embodiment of the present invention.

FIG. 2 is a block diagram of a free-running oscillation circuit according to an embodiment of the present invention. This figure includes an oscillator 210, pulse-width modulator 220, transistor M1 230, and capacitor C1 240. The oscillator 210 generates a clock signal on line 212. The clock signal has a frequency that is determined at least partially by the effective capacitance value provided by the capacitor C1 240 and transistor M1 230.

A condition signal is received on line 222 by the pulse-width modulator 220. This condition signal may be either a current or a voltage that is provided or generated in response to an environmental, process, or other condition or combination thereof. For example, the condition signal on line 22 may be in response to a temperature, power supply voltage, or other environmental condition. Alternately, the condition signal on line 222 may be in response to a process variation occurring during the manufacture of an integrated circuit that includes one or more of the circuits in this figure. In other embodiments, the condition signal on line 222 may be a control setting, for example, a voltage provided by a potentiometer. The condition signal 222 may be proportional to the condition itself or it may have another relationship to the condition. For example, the condition signal may be a current or a voltage that is proportional to absolute temperature.

The pulse-width modulator 220 converts the condition signal on line 222 into the adjust signal on line 224. Specifically, the pulse-width modulation circuit 220 varies the duty cycle of the adjust signal on line 224 as a function of the condition signal received on line 222.

The transistor M1 230 turns on and off under control of the level of the adjust signal on line 224, thus alternately connecting and disconnecting the capacitor C1 240 from the oscillator 210. The longer capacitor C1 240 is connected to the oscillator 210, the greater the effective capacitance value of the capacitor C1 240. While only one capacitor C1 240 and corresponding transistor M1 230 are shown, practical circuits typically include several such capacitor-transistor combinations in parallel or in series with each other, the transistors (or other switches) under control of various adjust signals.

Again, in a specific embodiment of the present invention, the adjust signal on line 224 is a sub-harmonic of the clock frequency on line 212. In this embodiment, the clock signal on line 212 clocks the pulse width modulation circuit 220. In one embodiment, the nominal frequency of the oscillator 210 is 1.280 GHz. This frequency is divided by a factor of four to 320 MHz, which is further divided by 32, resulting in a fundamental frequency of 10 MHz for the adjust signal on line 224. The duty cycle of this 10 MHz signal is then varied and provided as the adjust signal on line 224.

The relationship between the condition signal on line 222 and the adjust signal on line 224 may be different in various embodiments of the present invention. That is, the pulse width modulation circuit 220 may be configured such that the frequency of the clock signal on line 212 tracks in the condition signal on line 222. Alternately, other relationships are possible. For example, the pulse width modulation circuit 220 may be configured to provide a frequency for the clock signal on line 212 that is stable over changes in the condition that is measured to generate the condition signal on line 222.

A specific embodiment of the present invention provides an oscillator having a clock signal with a frequency that is stable over temperature. In order to achieve this, the oscillator first undergoes a calibration process. Examples of such a calibration process are shown in the next two figures.

Figure 3:
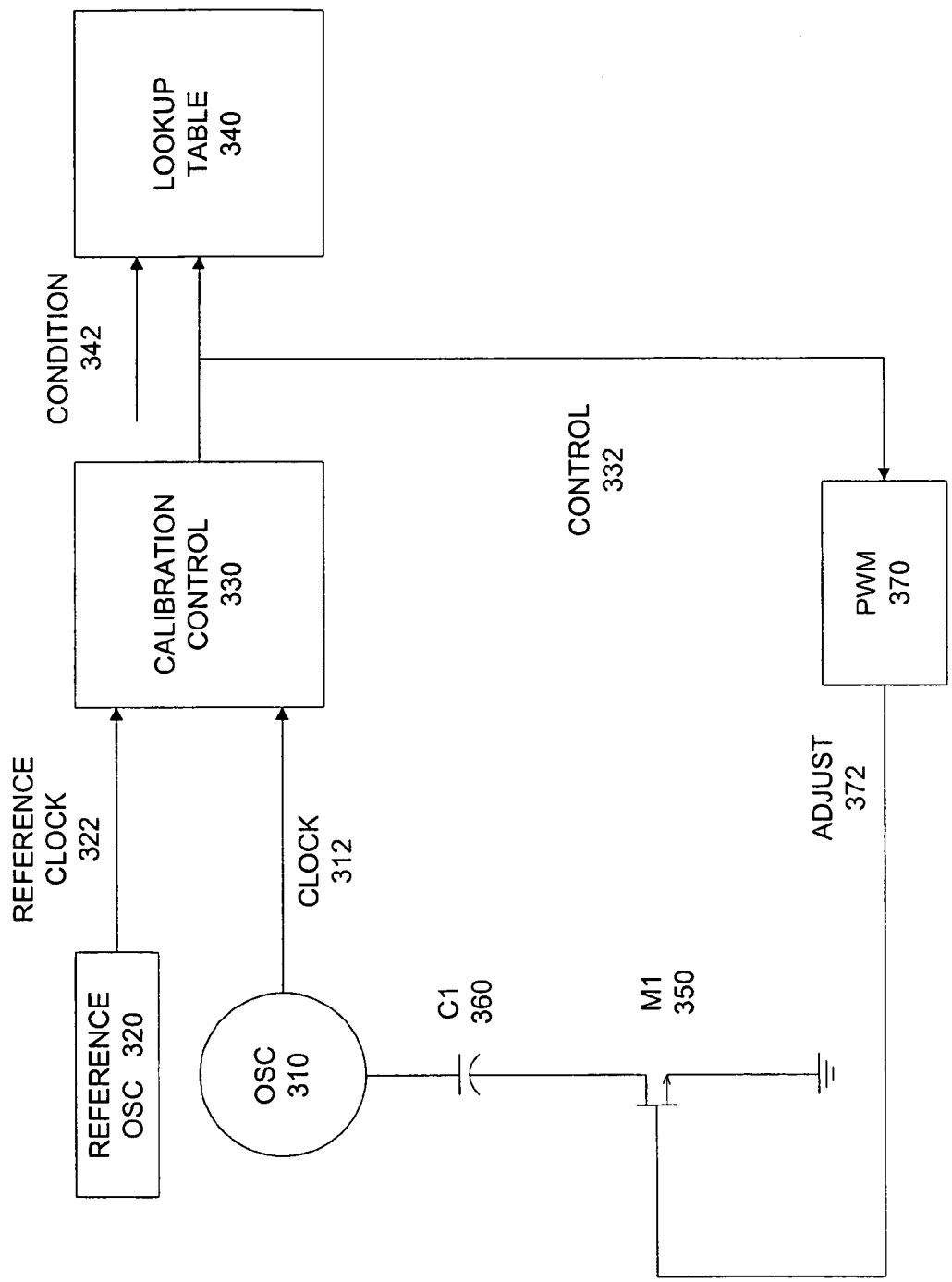
FIG. 3 is a block diagram illustrating the free-running oscillation circuit of FIG. 2 undergoing calibration.

FIG. 3 is a block diagram illustrating the free-running oscillation circuit of FIG. 2 while it is undergoing calibration. This figure includes an oscillator 310, reference oscillator 320, calibration control circuit 330, programmable lookup table 340, transistor M1 350, capacitor C1 360, and pulse width modulator circuit 370. The frequency of oscillation of the oscillator 310 is determined at least in part by the effective capacitance value provided by the capacitor C1 360. Typically, the oscillator 310, transistor M1 350, and capacitor C1 360 are included on an integrated circuit, while the reference oscillator 320 is separate. The calibration control circuit 330 and lookup table 340 may or may not be included on the integrated circuit depending on the exact implementation.

The reference oscillator 320 may be a crystal oscillator or other periodic source. Alternately, it may be such-a source in conjunction with one or more frequency multipliers or dividers. The calibration control circuit 330 includes a frequency detector that compares the frequency of the reference clock signal on line 322 to the frequency of the clock signal on line 312. From this information, the calibration control circuit 330 provides a control signal on line 332.

The calibration control circuit 330 varies the value of the control signal on line 332 in a manner depending on the relative frequencies of these input signals. When the frequency of the clock signal on line 312 is tuned within an acceptable margin of error to the frequency of the reference clock signal on line 322, the control signal on line 332, or other data corresponding to the control signal on line 332, is stored in the lookup table 340 along with the condition measurement. This process may be repeated at several condition values or states, and for one or more different conditions.

Once a number of control signal values and their corresponding condition measurements are stored in the lookup table 340, the data can be read out and further processed, though in other embodiments of the present invention, data is processed when determined without first being stored in a lookup table 340. In one embodiment of the present invention, a best-fit curve is generated based on the data. In a specific embodiment, this curve is described by a second-order polynomial, though in other embodiments of the present invention it may be a different type of curve having a different order. Alternately, the curve may be predefined where the data used to shift the curve, not to define it. Other variations or combinations can also be used. After the data is fit to a curve, several more control signal data points can be interpolated between the measured data points.

A processor that is external to the integrated circuit can perform the curve fitting and interpolation. For example, a processor that is part of a test or manufacturing system can perform either or both of these functions. Alternately, an on-chip processor can do either or both of these functions, or they may be shared between on-chip and off-chip processors.

The interpolated control signal values (or data corresponding to control signal values) can be stored in a lookup table or other memory. The data can be addressed by the corresponding condition measurement value. This lookup table can be the same lookup table 340 as is used to store condition measurements and control signal values before curve fitting is done. Alternately, another lookup table can be used. The lookup table or other memory used to store interpolated data is typically on-chip; though in other embodiments it can be off-chip.

In a specific embodiment of the present invention, an on-chip heating circuit is used to vary the temperature of an integrated circuit that includes a circuit to be calibrated. This heating circuit dissipates a variable amount of power in order to adjust die temperature; die temperature being the measured condition. One such heating circuit can be found in copending U.S. patent application Ser. No. 11/243,017, titled "On-Die Heating Circuit and Control Loop for Rapid Heating of the Die," by Jody Greenberg and Sehat Sutardja, filed Oct. 3, 2005, which is incorporated by reference.

The control signal values required for the frequency of the oscillator 310 to match the frequency of the reference oscillator 320 are stored for a number of temperatures. The temperature can be measured, or the temperature can be inferred given a specific level of power dissipation in the heater circuit. Since each temperature measurement costs money, embodiments of the present invention typically limit the number of temperature data points taken. For example, in one embodiment, two temperature data points are taken. An expected curve is used, where the two data points are used to shift and adjust the curve. In another embodiment of the present invention, five data points are used, and a second-order polynomial curve is fit to the data. In other embodiments, other curve-fitting techniques and other number of data points can be used.

From this curve, however it is generated, a larger number of data points can be interpolated. For example, in the specific embodiment, temperature is converted from an analog PTAT voltage to an 8-bit address using an 8-bit analog-to-digital converter. Accordingly, 256 data points are interpolated and stored in a memory or lookup table that is addressed by the digital conversion of the temperature. In other embodiments, converters having other resolutions and memories having other numbers of addressable locations can be used.

In operation, the temperature is measured, converted to a digital signal, and used to address a control signal value. The control signal value is used to generate a pulse-width modulated adjust signal, which in turn varies a capacitor value that tunes the oscillator to the desired frequency.

Figure 4A:
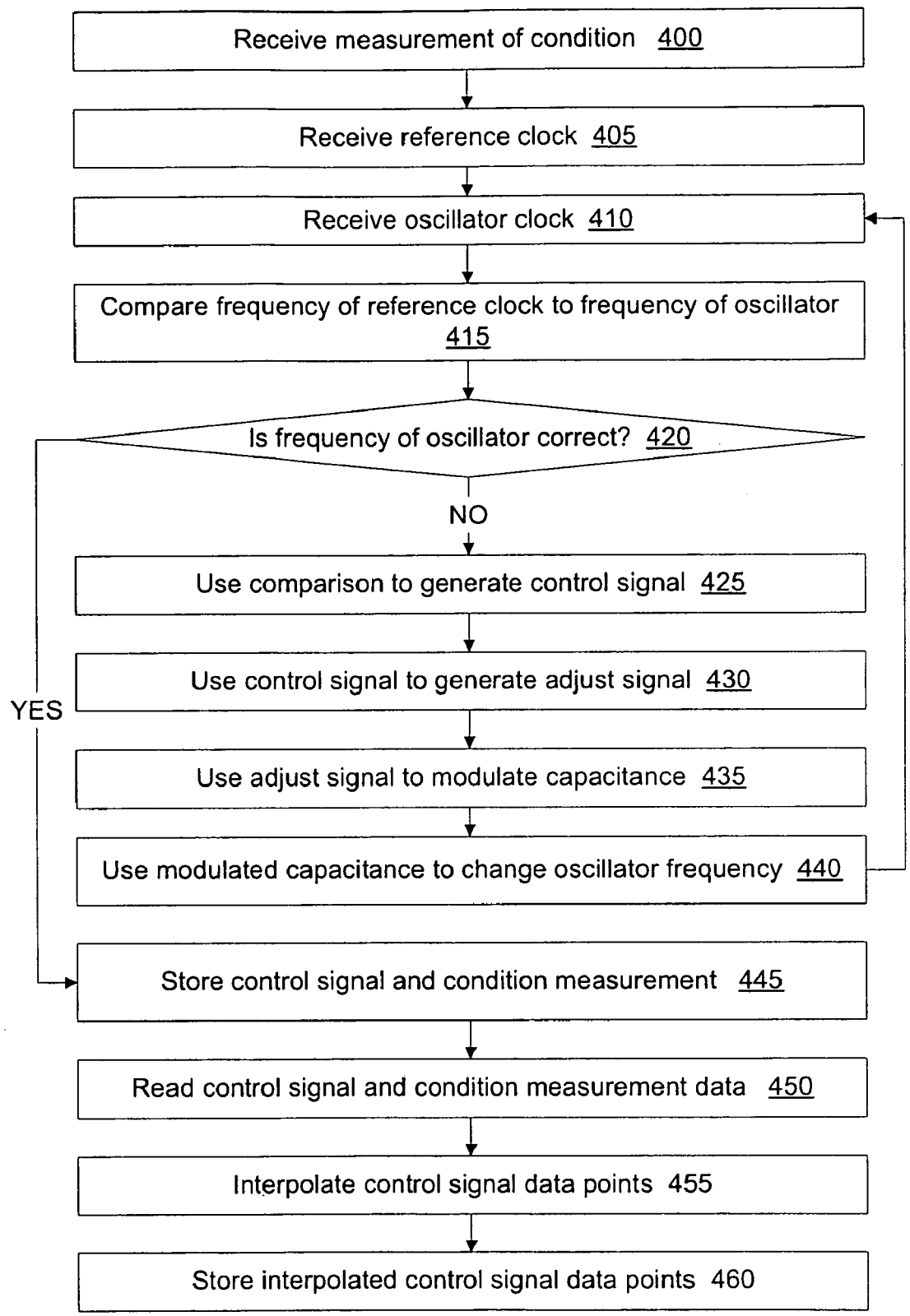
FIG. 4A is a flowchart of a method of calibrating the free-running oscillation circuit of FIG. 2.

FIG. 4A is a flowchart of a method of calibrating the free-running oscillation circuit of FIG. 2. A condition signal corresponding to an environmental, process, or other condition is received in act 400. In act 405, a reference clock signal is received. In act 410, an oscillator clock frequency is received. The frequency of the reference clock is compared to the frequency of the oscillator in act 415.

In act 420, it is determined whether the oscillator is operating at the correct frequency. Specifically, it is determined whether the frequency of the oscillator clock signal is within a margin of error of the frequency of the reference clock signal. If it is, the control signal value, or information corresponding to the control signal, can be stored with the measured condition value in act 445.

If it is not, the comparison is used to generate a control signal in act 425. The control signal is used to generate an adjust signal having a variable duty cycle in act 430. In act 435, the adjust signal is used to pulse-width modulate or vary a capacitance. The modulated capacitance changes the oscillator frequency in act 440. The oscillator clock, with its new frequency, can then be received and compared to the reference clock.

When data is taken at each of the desired temperatures, the condition values and corresponding data can be read in act 450. More data points can be interpolated, for example by use of curve fitting, in act 455. The interpolated control signal values can be stored in act 460.

While this calibration technique is well suited to calibrating a free-running oscillator, it may be used for other circuits as well. One method that is applicable to many other circuits is shown in the following figure.

Figure 4B:
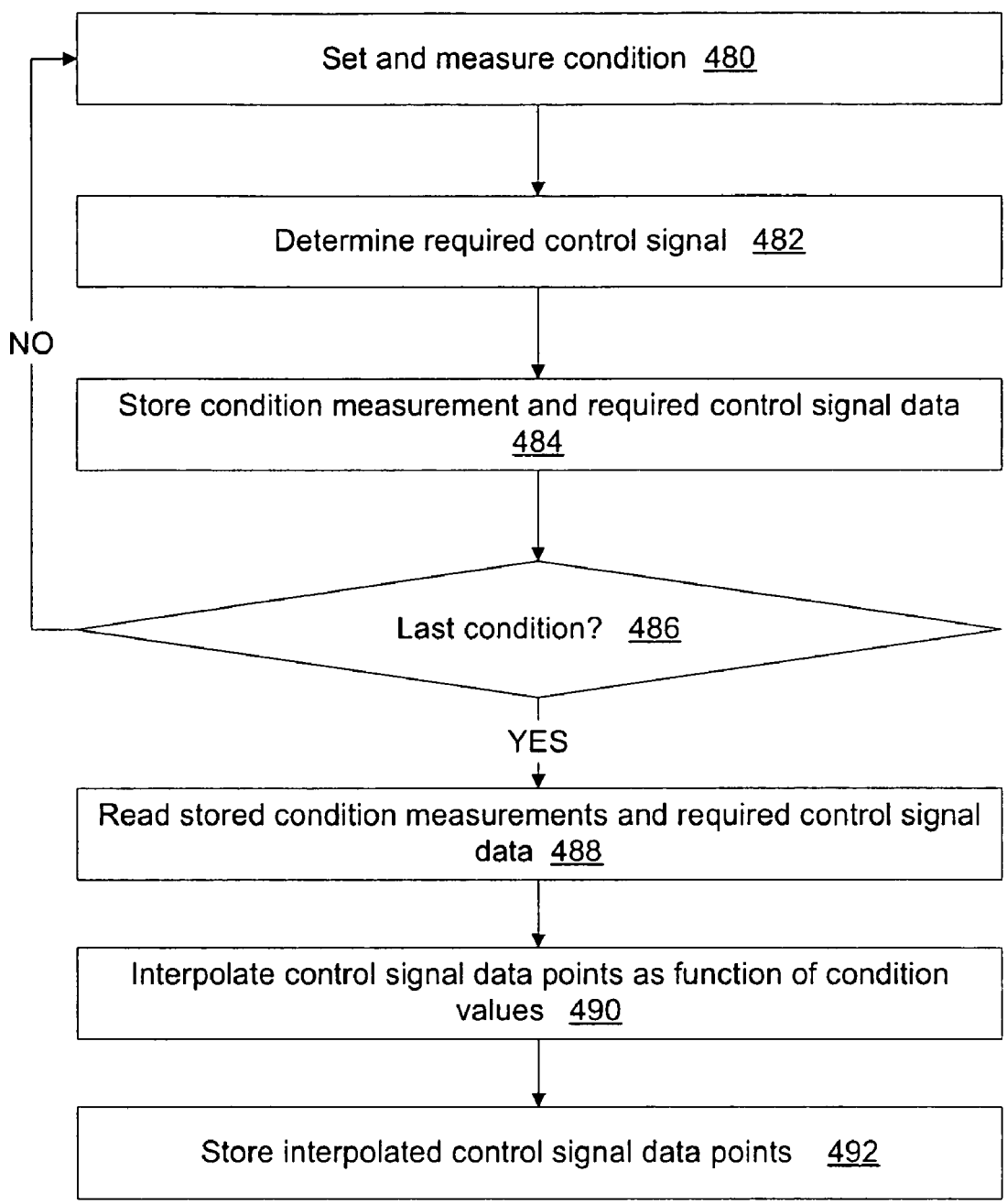
FIG. 4B is a flowchart of a method of calibrating a circuit according to an embodiment of the present invention.

FIG. 4B is a flowchart of a method of calibrating a circuit according to an embodiment of the present invention. In act 480, a condition is set and measured. For example, a temperature may be set using a heating circuit as described above. In act 482, a control signal that is required to achieve a desired outcome at the set condition is determined. In act 484, the condition measurement and required control signal data is stored. This data may be stored in an on-chip, or off-chip memory, FIFO, lookup table, registers, or other storage locations. Alternately, the data may be processed or further used in real-time without being stored. Alternately, the condition measurement values may be inferred, and the required control signal data stored at locations identified by those inferred values.

In act 486, it is determined whether data has been taken at the last condition. If it hasn't, the condition is set and measured again in act 480. When data has been taken at each desired condition, the stored condition measurements and required control signal data can be read in act 488. In act 490, additional control signal data points can be interpolated. This may be done by fitting the stored data to a curve, or by other method. One or more processors can perform this curve fitting and interpolation, and these processors can be on-chip or off-chip. Alternately, on-chip and off-chip circuits or processors can share the processing workload. In act 492, the interpolated control signal data points are stored. Typically, this data is stored on-chip, though it may be stored off-chip in various embodiments of the present invention. For example, the data may be stored in an on-chip lookup table or other memory, where address locations are identified by values of the condition signal.

Further refinements to the oscillator circuit shown in FIG. 2 may be desirable in some embodiments of the present invention. For example, a hysteresis buffer can be used to clean up the oscillator output signal. Also, various frequency dividers may be used such that a desired clock frequency is realized. Examples are described in the following two figures.

Figure 5:
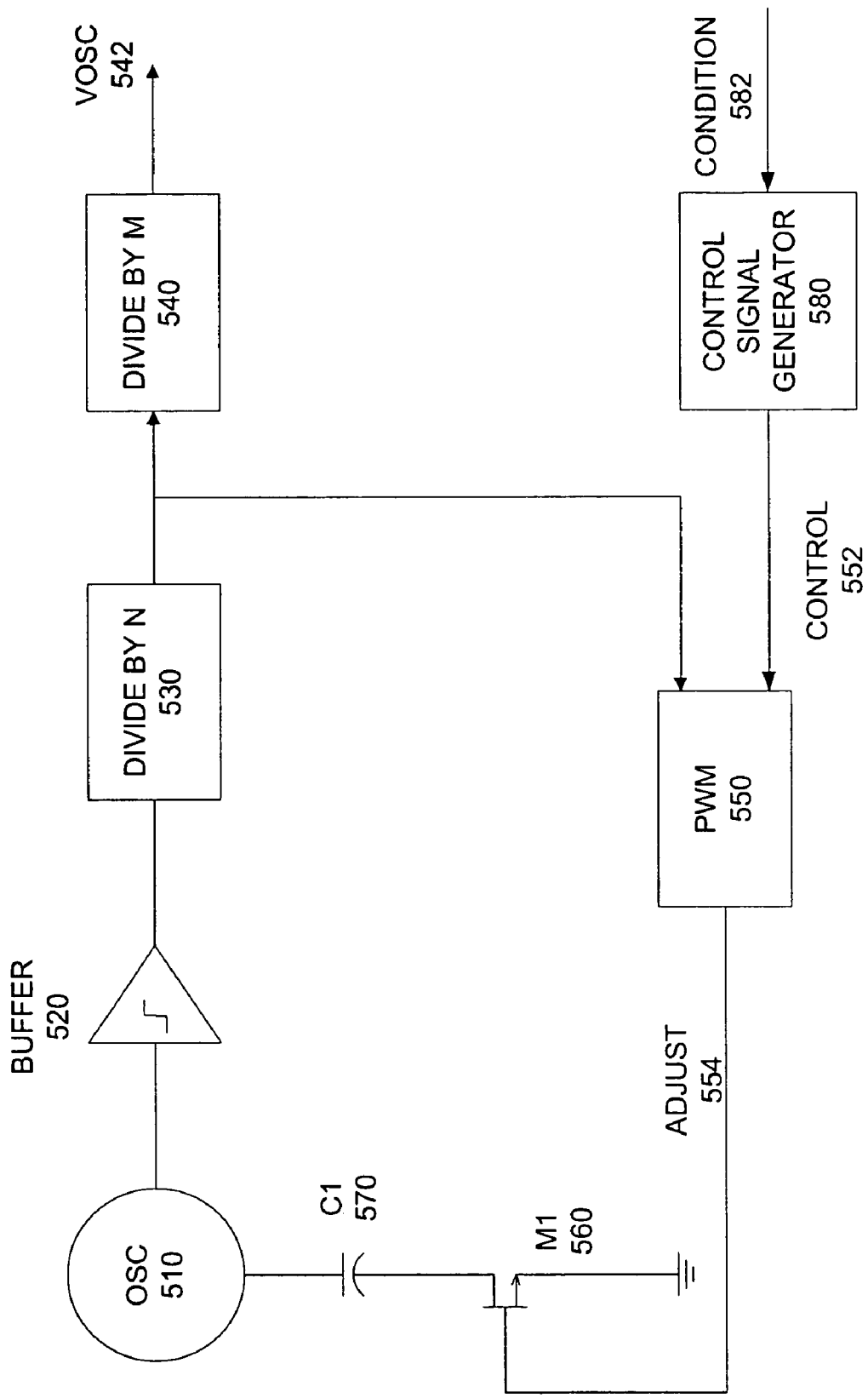
FIG. 5 is a more detailed block diagram of a free-running oscillation circuit according to an embodiment of the present invention.

FIG. 5 is a more detailed block diagram of a free-running oscillation circuit according to an embodiment of the present invention. This circuit includes an oscillator 510, buffer 520, dividers 530 and 540, pulse-width modulation circuit 550, transistor M1 560, capacitor C1 570, and control signal generator 580. The effective capacitance of the capacitor C1 570 at least partially determines a frequency response or characteristic of the oscillator 510, for examples its oscillation frequency. While only one capacitor C1 570 and corresponding transistor M1 560 is shown for simplicity, typical embodiments of the present invention included several such combinations in series or parallel controlled by various adjust signals.

The oscillator 510 provides an output oscillation signal to the buffer 520. The buffer 520 gains and sharpens the edges of the output signal provided by the oscillator 510, which is typically a low-amplitude sinusoid. The buffer 520 may also include hysteresis to provide a substantially glitch free output.

The output of the buffer 520 is received by a divider circuit 530, which divides the frequency provided by the oscillator by a factor of "N." This signal can further be divided by divider 540, which in this example divides the frequency by a factor of "M" to provide a signal Vosc on line 542. In other embodiments, other frequency dividers and multipliers may be used. These dividers may also be programmable.

The control signal generator circuit 580 receives a condition signal on line 582. Again, this signal may be derived by the measurement of an environmental, process, or other type of parameter. The control signal generator circuit 580 provides a control signal on line 552 to the pulse-width modulator circuit 550. The pulse width modulator circuit 550 provides an adjust signal on line 554 to the oscillator circuit. This signal has a duty cycle that is modulated as a function of the condition signal received on line 552.

The adjust signal on line 554 controls the impedance of transistor M1 560, which connects and disconnects capacitor C1 570 from the oscillator 510. Changes in the duty cycle of the adjust signal on line 554 varies the effective capacitance of capacitor C1 570 seen by the oscillator 510. This in turn varies its oscillation frequency, and thus the frequency of the output signal Vosc on line 542.

Figure 6:
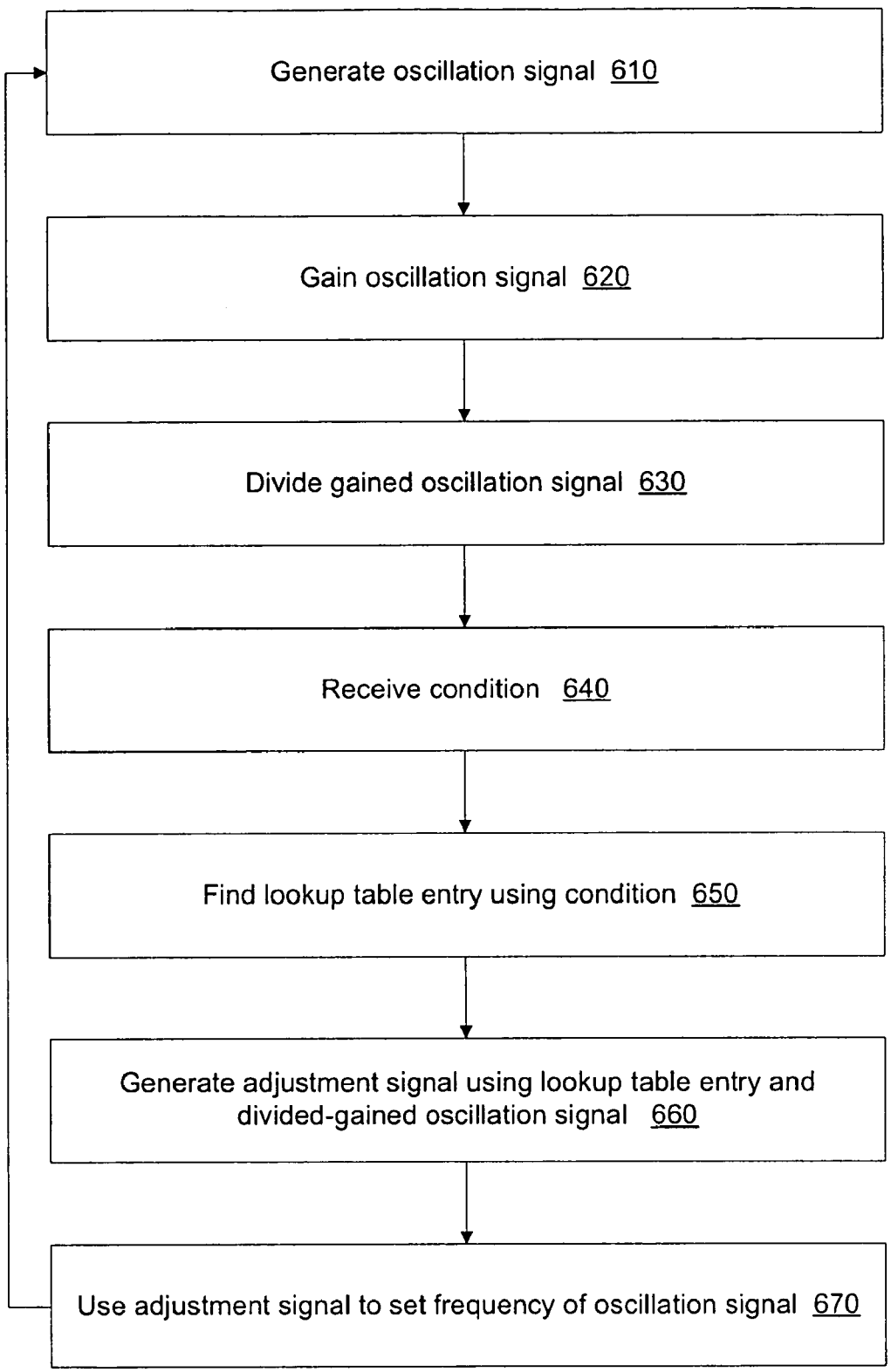
FIG. 6 is a flowchart illustrating the operation of the free-running oscillation circuit of FIG. 5.

FIG. 6 is a flowchart illustrating the operation of the free-running oscillation circuit of FIG. 5. An oscillation signal is generated in act 610. In act 620, this oscillation signal is gained. This has the effect of sharpening the edges and increasing the amplitude of the oscillation signal. In act 630, the frequency of the oscillation signal is divided. In act 640, a measurement of a condition is received. As before, the condition may be an environmental, process, or other type of condition. The measurement received may be a voltage or current that is related to the condition. For example, a voltage proportional to absolute temperature may be received.

In act 650, a lookup table entry is found using the measurement of the condition. In act 660, an adjustment signal is generated using the lookup table entry and the divided-gained oscillation signal. The adjustment signal is used to set the frequency of the oscillation signal in active 670.

The entries in the lookup table may be such that the resulting oscillation frequency remains constant over temperature. Alternately, they may be such that the resulting oscillation frequency has some relationship to temperature. In other embodiments, other conditions besides temperature may be used in finding entries in the lookup table. Further, more than one condition may be used by various embodiments of the present invention. In other embodiments, other memories or storage circuits can be used instead of a lookup table.

Figure 7:
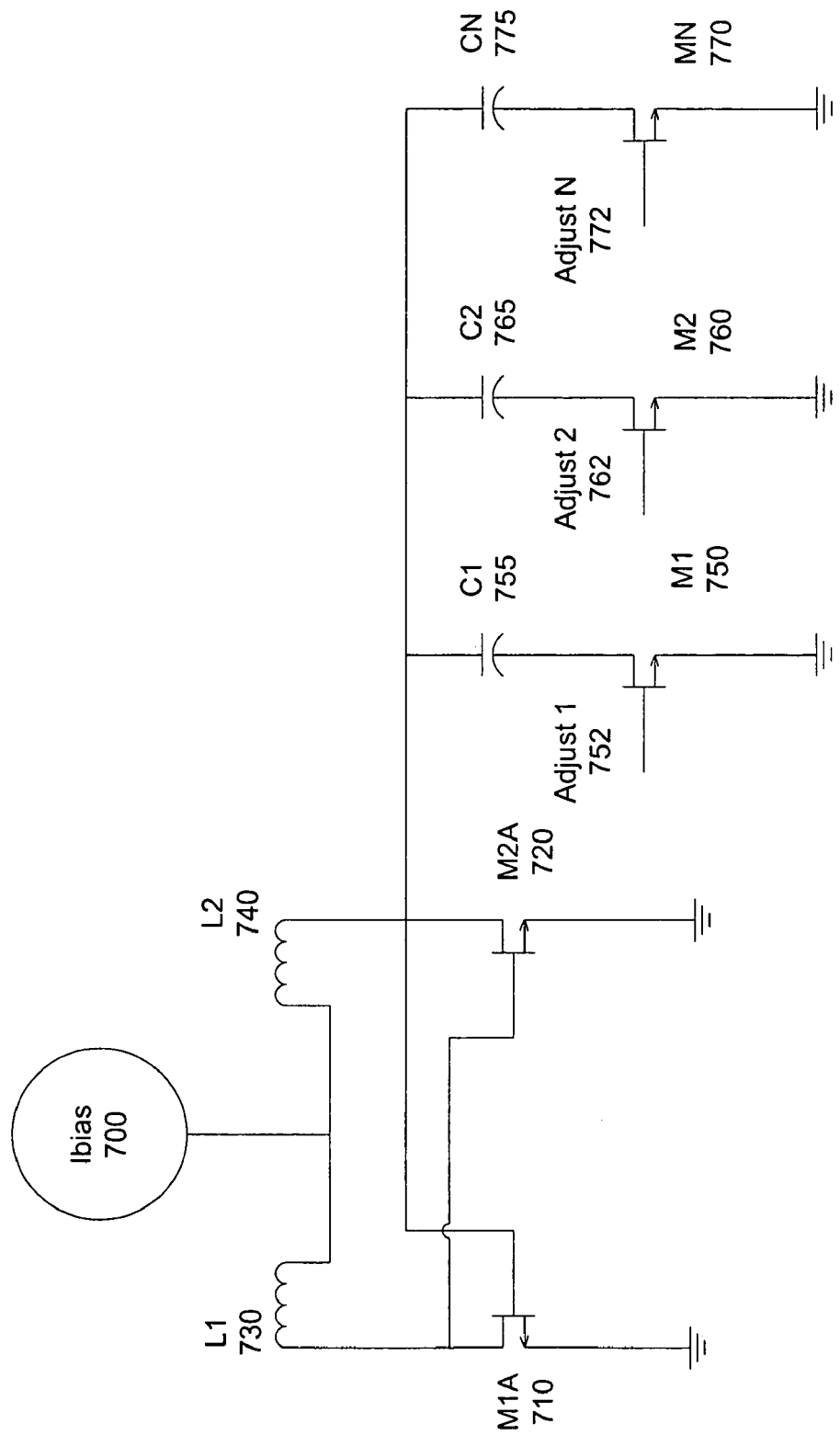
FIG. 7 is a schematic of an oscillator that may be used as the oscillator 510 in the free-running oscillation circuit of FIG. 5 or as an oscillator in other embodiments of the present invention.

FIG. 7 is a schematic of an oscillator that may be used as the oscillator 510 in the free-running oscillation circuit of FIG. 5, or as an oscillator in other embodiments of the present invention. This figure includes a bias current generator 700, an oscillator core (or tank) including transistors M1A 710 and M2A 720, load (or tank) inductors L1 730 and L2 740, and pulse-width modulated capacitors C1 755, C2 765, and CN 775, as well as their corresponding transistors M1 750, M2 760, and MN 770. Only the pulse-width modulated capacitors connected to the drain of M2A 720 are shown: corresponding capacitors and transistors connected to the drain of transistor M1 710 are omitted for clarity. The gates of the omitted corresponding transistors can be driven by the same signals as transistors M1 750, M2 750, and MN 770, thought they may be driven by other signals. Other capacitors that are not selectively coupled and decoupled from the oscillator core are also typically connected to the drains of M1A 710 and M2A 720, these to have been omitted for clarity.

The frequency of oscillation of this circuit is determined by the values of the inductors and the effective capacitance values seen by those inductors. These capacitors may be connected or disconnected by their corresponding transistors on a steady-state basis, or they may be switched by a signal having a duty cycle under control of a pulse with modulation circuit.

In one embodiment of the present invention, there are 16 capacitors and corresponding transistors connected to the drain of M2A 720, and 16 other capacitors connected to the drain of M1A 710. These transistors can be equally weighted, and they can be switched under control of 4 bits that are thermally decoded into 16 adjust signals. The signals can have a duty cycle that is varied in increments of one thirty-second of the period of the adjust signals. In other embodiments, other numbers of capacitors may be used, and their values may be weighted in a different manner. For example, they may be binarily weighted, and four, eight, or thirty-two capacitors may be used. Further, the duty cycle may be varied in equal or-unequal increments, and the number of increments may be more or less than 32. For example, the duty cycle may be varied in eighths, sixteenths, or sixty-fourths of the adjust signal period. Alternately, non-binary numbers may be used for any of these parameters.

In one exemplary embodiment of the present invention, a maximum frequency for the oscillation circuit is achieved when all capacitors remain disconnected by their corresponding transistors. The frequency of oscillation can be reduced by one quantum by applying an adjust signal having a minimum duty cycle to one transistor (or typically, one transistor connected to a capacitor that is connected to the drain of M1 A710 and one transistor connected to a capacitor that is connected to the drain of M2A 720). The frequency of oscillation can further be reduced by increasing this duty cycle, until the transistor remains on, that is, until its adjust signal has a duty cycle of one.

Further decreases in oscillator frequency are achieved by applying an adjust signal having a minimum duty cycle to a second transistor while the first transistor remains fully on and the remaining transistors remain off. Decreases in oscillator frequency can continue until all transistors remained fully on, at which point a minimum oscillation frequency is reached. The operation of one exemplary pulse-width modulator that provides signals such as these is shown in the next two figures.

Figure 8:
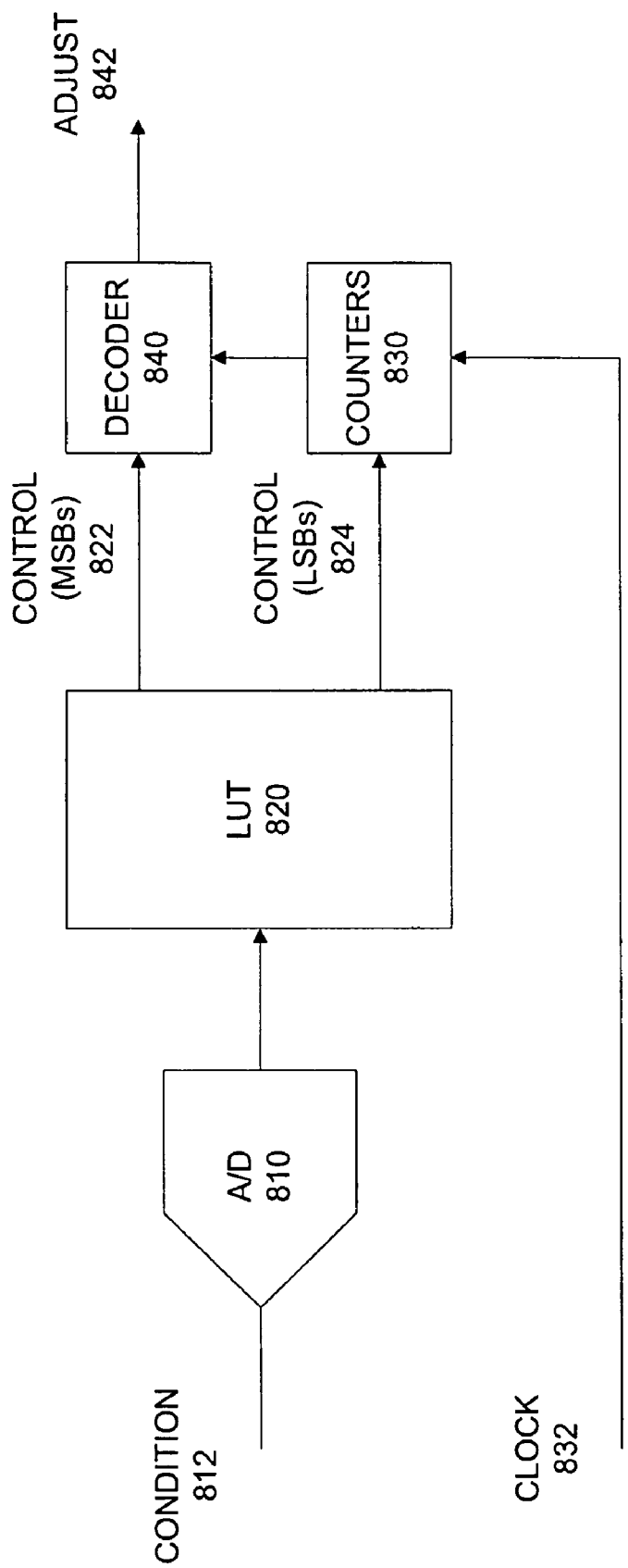
FIG. 8 illustrates a control signal generator and pulse-width modulator that may be used as the control signal generator and pulse-width modulator of FIG. 5 or as a control signal generator and pulse-width modulator in other embodiments of the present invention.

FIG. 8 is a control signal generator and pulse-width modulator that may be used as the control signal generator and pulse-width modulator of FIG. 5 or as a control signal generator and pulse-width modulator in other embodiments of the present invention. This figure includes a control signal generator made up of an analog-to-digital converter 810 and lookup table 820, and a pulse-width modulator made up of a counter 830 and decoder 840. In other embodiments of the present invention, other circuits can be used to implement the control signal generator and pulse-width modulator.

A condition signal is received on line 812 by the analog-to-digital converter 810. The analog-to-digital converter provides a digital word that is used to address the lookup table 820. The lookup table in turn provides a control signal to the counter 830 and decoder 840.

The control signal MSBs provided by the lookup table 820 on line 822 to the decoder 840 are decoded and provided as a number of adjust signals on lines 842. In one embodiment of the present invention, a thermometer decoder is used. A thermometer decoder decodes binarily weighted bits into a number of equally weighted bits. The control signal LSBs on line 824 provided to the counter 830 are used to control the duty cycle of at least one of the adjust signals on lines 842, as is shown in the timing diagram which follows.

Figure 9:
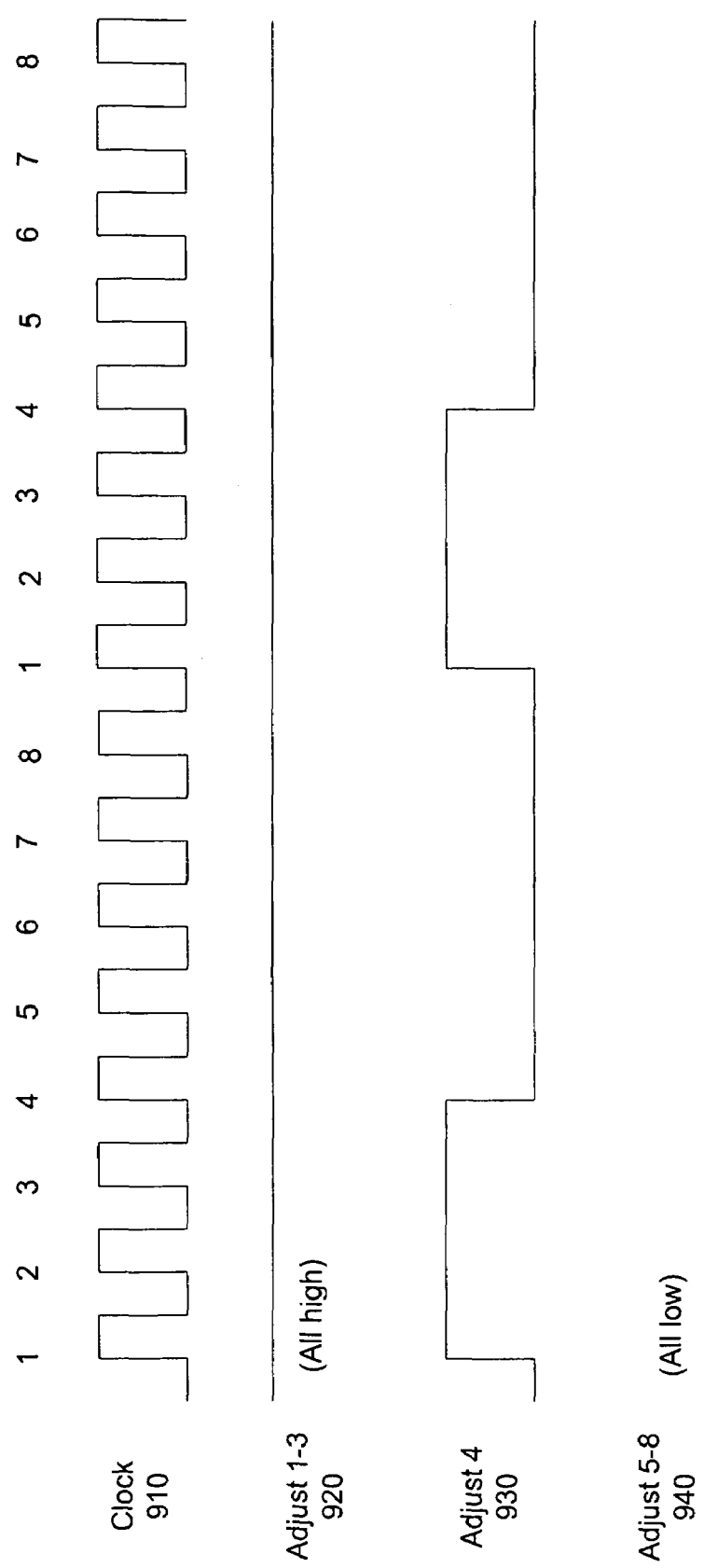
FIG. 9 is a timing diagram illustrating the operation of the pulse-width modulator of FIG. 8.

FIG. 9 is a timing diagram illustrating the operation of the pulse-width modulator of FIG. 8. This figure includes a clock signal 910, adjust 1-3 signals 920, adjust 4 signal 930, and adjust 5-8 signals 940. The state of these signals represents one of 64 possible states for this exemplary embodiment of the present invention.

In this example, the adjust 1-3 signals 920 remain high, while adjust 5-8 signals 940 remain low. The adjust 4 signal 930 has a variable signal that has a duty cycle of three-eighths. That is, it is high for three cycles of the clock 910, and low for 5 clock cycles. In this embodiment, the eight adjust signals are decoded from three bits provided by lookup table, while the duty cycle is controlled by another three bits provided by lookup table. In a specific embodiment of the present invention, four bits are provided to the decoder for 16 adjust signals, and five bits are provided to the counter, for 32 possible duty cycles. In this embodiment, there are 512 possible signal states, that is, the capacitance of the tank circuit can be varied in 512 increments.

In this example, the effective capacitance can be reduced one quantum by changing the duty cycle to one-fourth, or increased one quantum by changing the duty cycle to one-half. In other embodiments, the period may be less than or more than 8 clock cycles, and more or less than eight adjust signals may be generated.

The capacitance seen by the oscillator when the adjust 4 signal 930 is high is greater than when the adjust 4 signal 930 is low. Accordingly, the oscillator tries to alternately decrease and increase its frequency. This would cause frequency modulation of the clock. However, if the clock is divided by the same ratio or integer multiple thereof as the pulse width modulated frequency, then the frequency modulation is substantially cancelled.

Figure 10B:
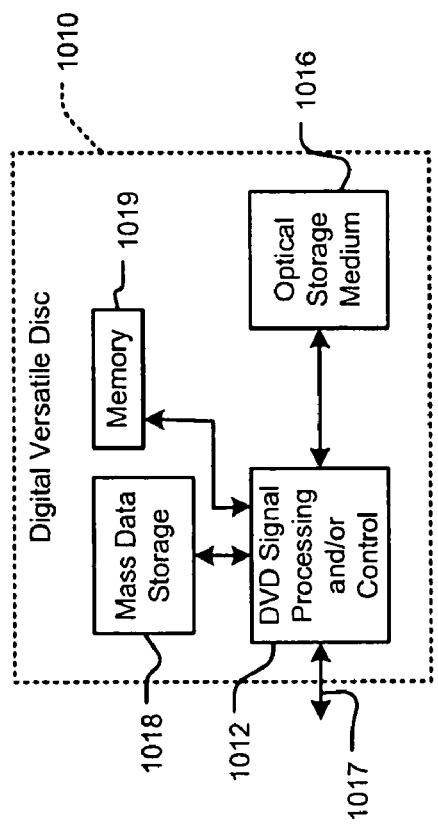
FIGS. 10A-10H illustrate various implementations of exemplary embodiments of the present invention.
Figure 10A:
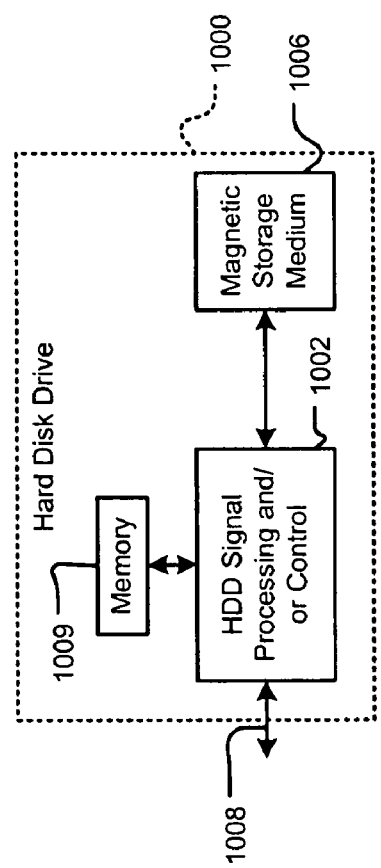

Referring now to FIGS. 10A-10G, various exemplary implementations of the present invention are shown. Referring to FIG. 10A, the present invention may be embodied in a hard disk drive 1000. The present invention may implement either or both signal processing and/or control circuits, which are generally identified in FIG. 10A at 1002. In some implementations, signal processing and/or control circuit

1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Referring now to FIG. 10B, the present invention maybe embodied in a digital versatile disc (DVD) drive 1010. The present invention may implement either or both signal processing and/or control circuits, which are generally identified in FIG. 10B at 1012, and/or mass data storage 1018 of DVD drive 1010. Signal processing and/or control circuit 1012 and/or other circuits (not shown) in DVD 1010 may process data, perform coding and/or encryption, perform calculations, and/or format data that is read from and/or data written to an optical storage medium 1016. In some implementations, signal processing and/or control circuit 1012 and/or other circuits (not shown) in DVD 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD 1010 may communicate with mass data storage 1018 that stores data in a nonvolatile manner. Mass data storage 1018 may include a hard disk drive (HDD) such as that shown in FIG. 10A. The HDD may be a mini HDD that includes one or more platters having a diameter that is smaller than approximately 1.8". DVD 1010 may be connected to memory 1019, such as RAM, ROM, low latency nonvolatile memory such as flash memory, and/or other suitable electronic data storage.

Figure 10D:
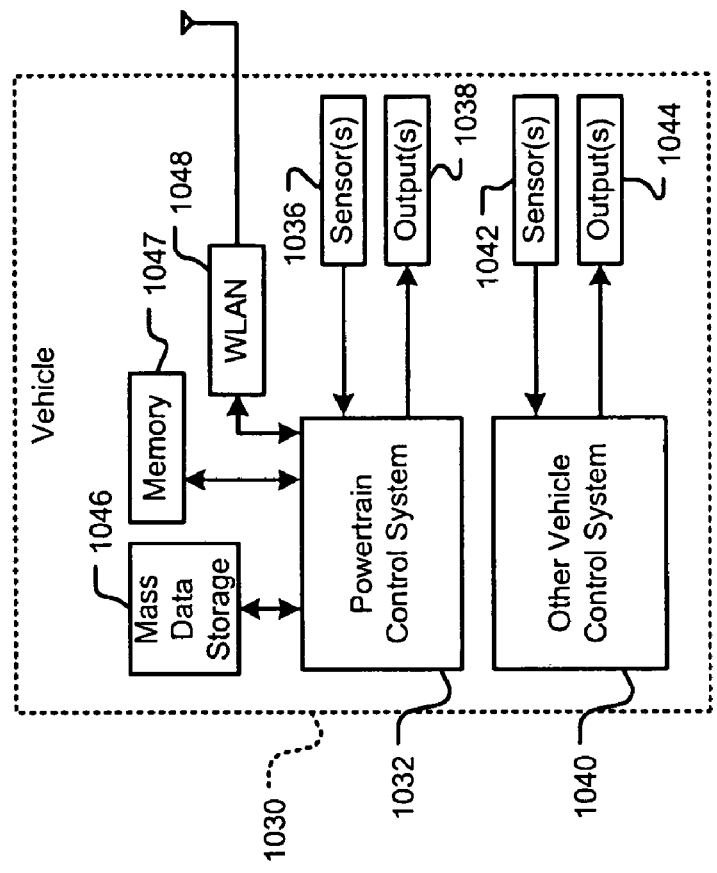
Figure 10C:
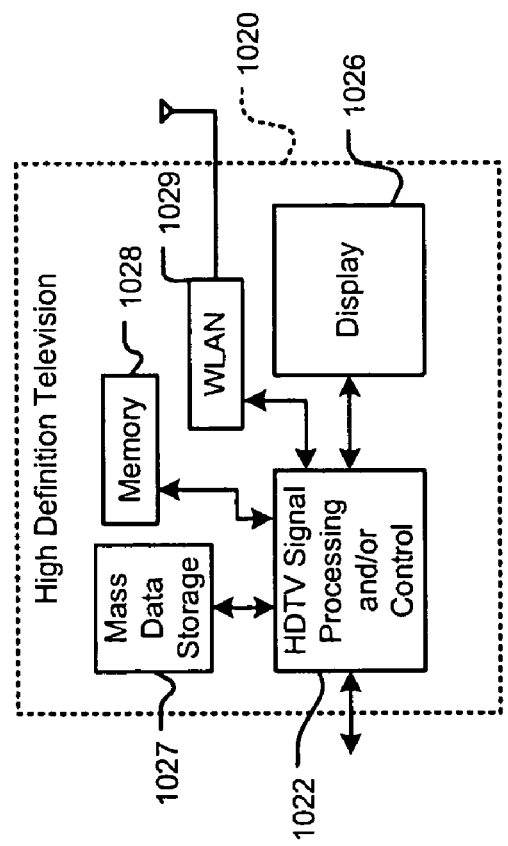

Referring now to FIG. 10C, the present invention may be embodied in a high definition television (HDTV) 1020. The present invention may implement either or both signal processing and/or control circuits, which are generally identified in FIG. 10C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 10A and/or at least one DVD may have the configuration shown in FIG. 10B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Referring now to FIG. 10D, the present invention implements a control system of a vehicle 1030, a WLAN interface and/or mass data storage of the vehicle control system. In some implementations, the present invention implements a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 10E:
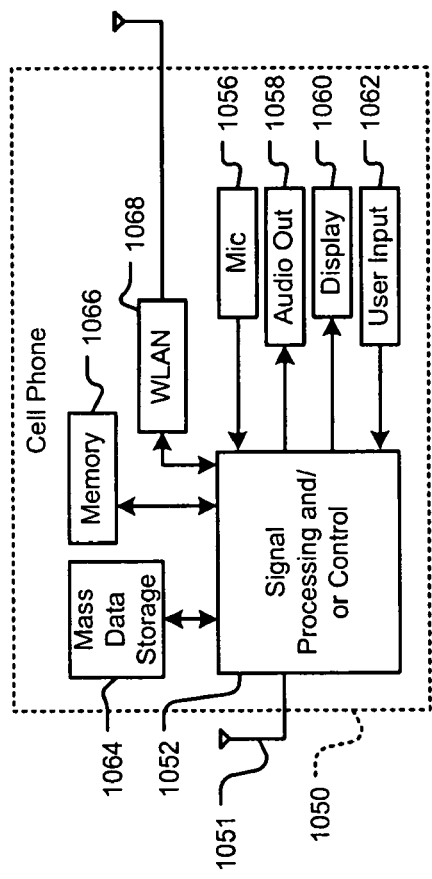

Referring now to FIG. 10E, the present invention may be embodied in a cellular phone 1050 that may include a cellular antenna 1051. The present invention may implement either or both signal processing and/or control circuits, which are generally identified in FIG. 10E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 10F:
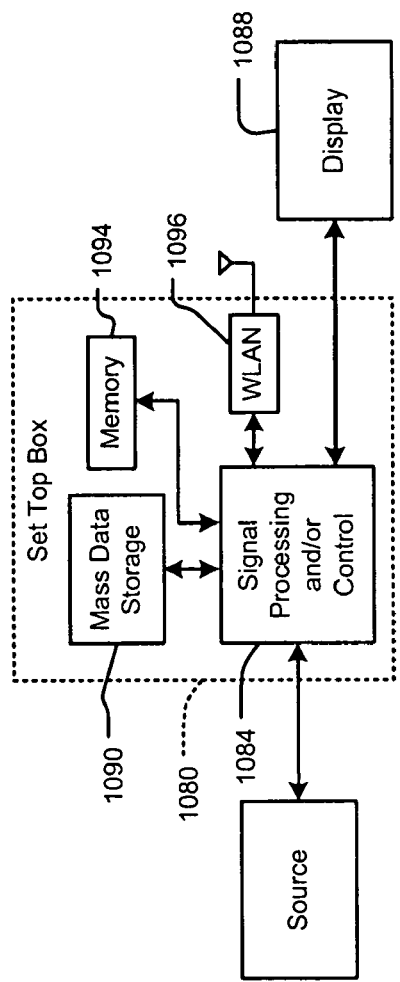

Referring now to FIG. 10F, the present invention may be embodied in a set top box 1080. The present invention may implement either or both signal processing and/or control circuits, which are generally identified in FIG. 10F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner. Mass data storage 1090 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 10G:
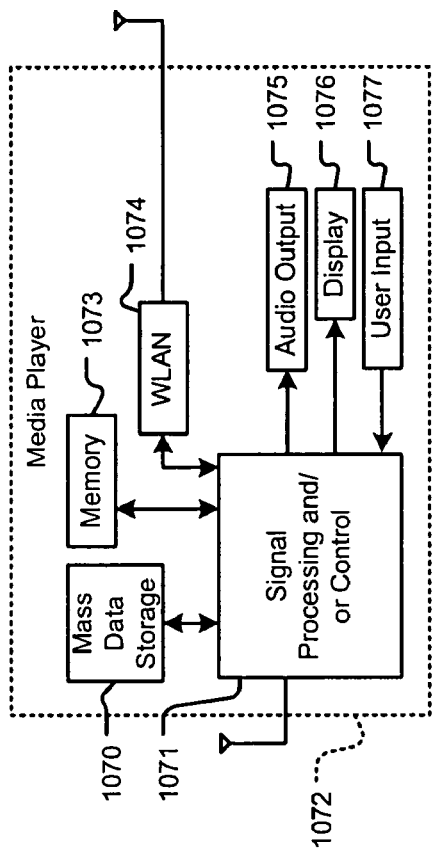

Referring now to FIG. 10G, the present invention may be embodied in a media player 1072. The present invention may implement either or both signal processing and/or control circuits, which are generally identified in FIG. 10G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 10H:
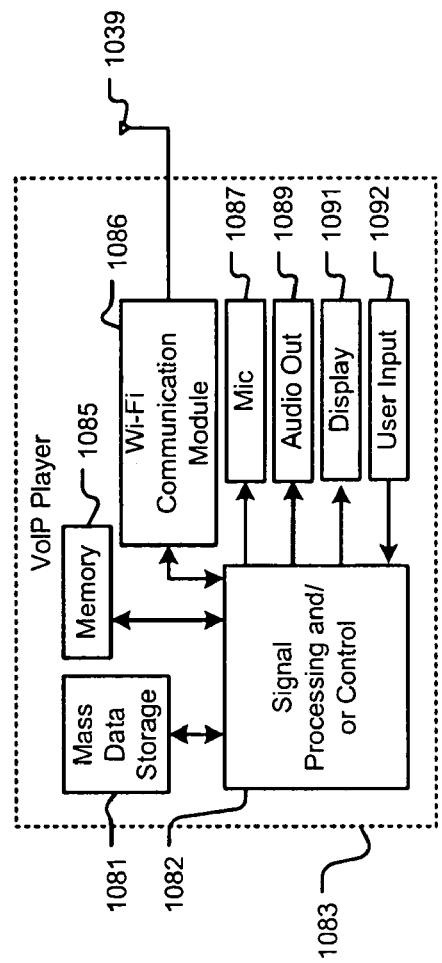

Referring to FIG. 10H, the present invention may be embodied in a Voice over Internet Protocol (VoIP) phone 1083 that may include an antenna 1039. The present invention may implement either or both signal processing and/or control circuits, which are generally identified in FIG. 10H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 502 that stores data in a nonvolatile manner such as optical and/or magnetic storage devices, for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". VoIP phone 1083 maybe connected to memory 1085, which maybe a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of tuning a frequency characteristic of an integrated circuit comprising:
   receiving a measurement of a condition;
   using the measurement of the condition to set a duty cycle of a pulse-width modulated signal;
   varying a capacitance by intermittently switching a switch on and off using the pulse-width modulated signal to control a frequency of an oscillator; and
   receiving an oscillator output signal and dividing down a frequency of the oscillator output signal as a function of the pulse-width modulated signal to generate a substantially jitter free oscillator output signal.

2. The method of claim 1 wherein the condition is temperature.

3. The method of claim 1 wherein switching the switch on and off comprises controlling the impedance of the switch using the pulse-width modulated signal.

4. The method of claim 1 wherein the capacitance is varied by driving a gate of a transistor with the pulse-width modulated signal.

5. The method of claim 4 wherein the pulse-width modulated signal is generated by using the measurement of the condition to retrieve a stored entry.

6. The method of claim 4 wherein the integrated circuit comprises the oscillator.

7. A method of tuning a frequency characteristic of an integrated circuit comprising:
   receiving a measurement of a condition;
   retrieving a stored entry using the measurement of the condition;

generating a pulse-width modulated signal using the entry;

identifying a capacitor from a plurality of capacitors for use in controlling a frequency of an oscillator, each capacitor of the plurality of capacitors coupled in series to a respective switch;

intermittently switching the switch corresponding to the identified capacitor on and off using the pulse-width modulated signal; and receiving an oscillator output signal and dividing down a frequency of the oscillator output signal as a function of the pulse-width modulated signal to generate a substantially jitter free oscillator output signal, wherein any one of the plurality of capacitors is operable to be identified for controlling the frequency of the oscillator using the pulse-width modulated signal.

8. The method of claim 7 wherein the switch corresponding to the identified capacitor is an MOS transistor.

9. The method of claim 7 wherein the condition is temperature.

10. The method of claim 7 wherein the measurement of a condition is a voltage proportional to temperature.

11. The method of claim 10 wherein the integrated circuit comprises the oscillator.

12. The method of claim 7 further comprising:
generating the measurement of the condition by generating a voltage proportional to temperature;
converting the voltage to a digital signal; and
retrieving the stored entry using the digital signal.

13. The method of claim 12 wherein the stored entry is determined such that the frequency of the oscillator is stable over temperature.

14. The method of claim 12 wherein the voltage is converted to a digital signal using an analog-to-digital converter.

15. The method of claim 12 wherein the switch corresponding to the identified capacitor is a MOS transistor.

16. An integrated circuit comprising:
a control signal generator having an input responsive to a measurement of a condition and configured to provide a control signal in response to the measurement of the condition;
a pulse width modulation circuit having an input responsive to the control signal and an output configured to provide a pulse-width modulated signal in response to the control signal;
a switch operable to vary a capacitance by intermittently switching on and off in response to the pulse-width modulated signal to control a frequency of an oscillator;
a buffer operable to output an oscillator output signal; and
a divider configured to divide down a frequency of the oscillator output signal as a function of the pulse-width modulated signal to generate a substantially jitter free oscillator output signal.

17. The integrated circuit of claim 16 wherein the condition is temperature.

18. The integrated circuit of claim 17 further comprising: a capacitor in series with the switch.

19. The integrated circuit of claim 17 wherein the integrated circuit comprises the oscillator.

20. The integrated circuit of claim 18 wherein the integrated circuit comprises the oscillator, the oscillator oscillating at the frequency determined at least in part by the capacitor and the pulse width modulated signal's duty cycle.

21. The integrated circuit of claim 17 wherein the control signal generator comprises a lookup table.

22. An integrated circuit comprising:
a memory comprising a plurality of entries, each entry corresponding to a value of a measurement of a condition;
a pulse-width modulator circuit configured to generate a pulse-width modulated signal, the pulse-width modulated signal having a duty cycle, the duty cycle determined by an entry in the memory;
a switch operable to vary a capacitance by intermittently switching on and off as a function of the pulse width modulated signal to control a frequency of an oscillator;
a buffer operable to output an oscillator output signal; and
a divider configured to divide down a frequency of the oscillator output signal as a function of the pulse-width modulated signal to generate a substantially jitter free oscillator output signal.

23. The integrated circuit of claim 22 wherein the switch is an MOS transistor.

24. The integrated circuit of claim 22 further comprising an analog-to-digital converter configured to convert an analog voltage corresponding to the measurement of the condition to a digital signal and further configured to provide the digital signal to the memory.

25. The integrated circuit of claim 24 wherein the measurement of a condition is a voltage proportional to temperature.

26. The integrated circuit of claim 25 wherein the integrated circuit comprises the oscillator.

27. An oscillator comprising:
a condition measurement circuit configured to provide an analog voltage proportional to temperature;
an analog-to-digital converter configured to convert the analog voltage to a digital signal;
a lookup table responsive to the digital signal from the analog-to-digital converter;
a pulse-width modulation circuit configured to provide a pulse-width modulated signal having a duty cycle, the duty cycle controlled by entries in the lookup table;
a transistor having a gate responsive to the pulse-width modulated signal;
a capacitor in series with the transistor, the capacitor used for controlling a frequency of an oscillator;
a buffer operable to output an oscillator output signal; and
a divider configured to divide down a frequency of the oscillator output signal as a function of the pulse-width modulated signal to generate a substantially jitter free oscillator output signal.

28. The oscillator of claim 27 wherein the lookup table comprises multiple entries, the entries determined such that the frequency of the oscillator is stable over temperature.

29. The oscillator of claim 27 wherein the condition measurement circuit is a proportional-to-absolute temperature voltage generator.

30. The oscillator of claim 27 wherein the transistor is a MOS transistor.

* * * * *

UNITED STATES PATENT AND TRADEMARK OFFICE
CERTIFICATE OF CORRECTION

PATENT NO. : 7,375,597 B2  
APPLICATION NO. : 11/242230  
DATED : May 20, 2008  
INVENTOR(S) : Jody Greenberg et al.

Page 1 of 1

It is certified that error appears in the above-identified patent and that said Letters Patent is hereby corrected as shown below:

In the Claims

Column 17, line 43, before "modulation circuit" delete "pulse width" and substitute --pulse-width-- in its place.

Column 18, line 2, after "capacitor and the" delete "pulse width" and substitute --pulse-width-- in its place.

Column 18, line 14, after "function of the" delete "pulse width" and substitute --pulse-width-- in its place.

Signed and Sealed this

Twenty-sixth Day of August, 2008

JON W. DUDAS  
*Director of the United States Patent and Trademark Office*